/

US011600051B2

(12) United States Patent
Aleem et al.

(10) Patent No.: US 11,600,051 B2
(45) Date of Patent: Mar. 7, 2023

(54) PREDICTION OF CONTACT POINTS BETWEEN 3D MODELS

(71) Applicant: GOOGLE LLC, Mountain View, CA (US)

(72) Inventors: Idris Aleem, Kitchener (CA); Cecilia Abadie, Montara, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 17/302,108

(22) Filed: Apr. 23, 2021

(65) Prior Publication Data

US 2022/0343608 A1     Oct. 27, 2022

(51) Int. Cl.
| | |
|---|---|
| *G06T 17/00* | (2006.01) |
| *G06N 20/00* | (2019.01) |
| *G06F 30/27* | (2020.01) |
| *G06T 19/00* | (2011.01) |
| *G02B 27/01* | (2006.01) |

(52) U.S. Cl.
CPC ........ *G06T 19/006* (2013.01); *G02B 27/0172* (2013.01); *G06F 30/27* (2020.01); *G06N 20/00* (2019.01); *G06T 17/00* (2013.01)

(58) Field of Classification Search
CPC ....... G06T 19/006; G06T 17/00; G06N 20/00; G06F 30/27; G02B 27/0172
USPC ....................................................... 345/633
See application file for complete search history.

(56) References Cited

U.S. PATENT DOCUMENTS

| | | | |
|---|---|---|---|
| 9,811,948 B2 * | 11/2017 | Van Bree | ............ G06F 3/04815 |
| 2005/0162419 A1 | 7/2005 | Kim et al. | |
| 2011/0029470 A1 * | 2/2011 | Hartmann | ................ G01B 5/20 |
| | | | 706/15 |
| 2011/0051077 A1 * | 3/2011 | Sugihara | ............ G02B 27/0172 |
| | | | 351/158 |
| 2014/0293220 A1 | 10/2014 | Kornilov et al. | |
| 2020/0387229 A1 * | 12/2020 | Ravasz | ................ G02B 27/017 |
| 2021/0041701 A1 * | 2/2021 | Kassner | ................ G06V 40/19 |
| 2021/0110001 A1 * | 4/2021 | Mitchell | ................ G06N 20/00 |

* cited by examiner

*Primary Examiner* — Hai Tao Sun
(74) *Attorney, Agent, or Firm* — Brake Hughes Bellermann LLP

(57) ABSTRACT

According to an aspect, a method includes receiving a first three-dimensional model (3D) model of at least a body part of a person, receiving a second 3D model of a wearable device, and predicting, by at least one machine-learning (ML) model, a plurality of contact points between the first 3D model and the second 3D model.

20 Claims, 12 Drawing Sheets

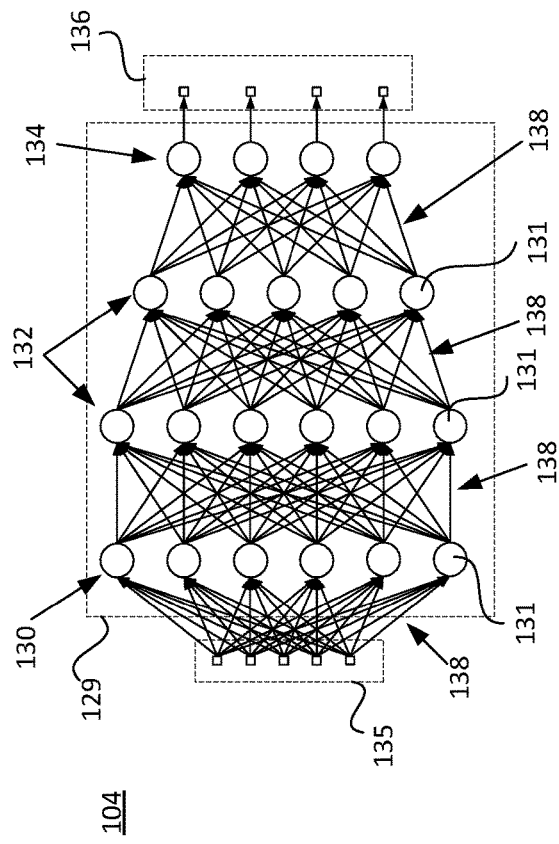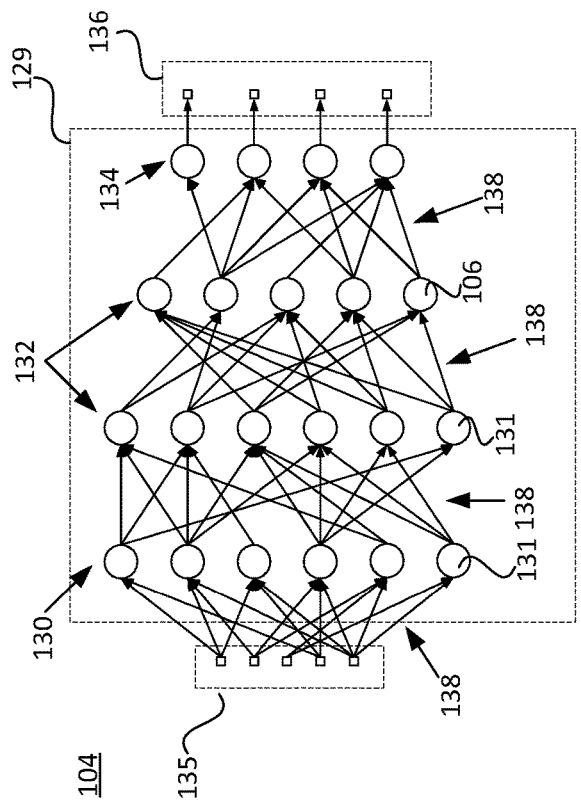
FIG. 1B
FIG. 1C

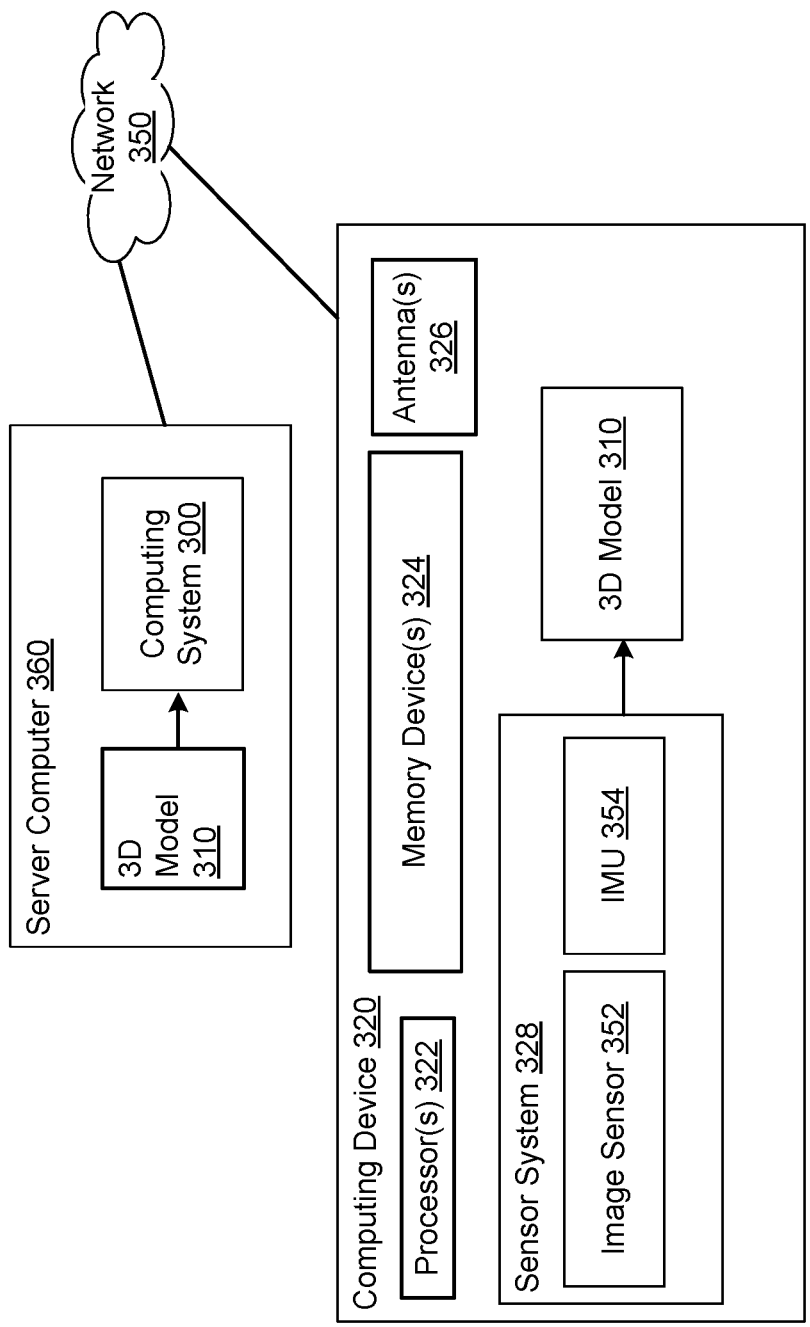

PREDICTION OF CONTACT POINTS BETWEEN 3D MODELS

TECHNICAL FIELD

This description generally relates to the prediction of contact points between three-dimensional (3D) models, and, in particular, to the prediction of contact points between a 3D model associated with a wearable device and a 3D model associated with at least a body part of a person.

BACKGROUND

Wearable devices may include smartglasses, earbuds, watches, fitness trackers, cameras, body sensors, etc. A wearable device may be worn on the skin of a user, and the manner in which the wearable device fits or feels on the user is dependent upon the body/facial features of a particular user and how the structure of the wearable device interacts with the relevant body part.

SUMMARY

According to an aspect, a method includes receiving a first three-dimensional model (3D) model of at least a body part of a person, receiving a second 3D model of a wearable device, and predicting, by at least one machine-learning (ML) model, a plurality of contact points between the first 3D model and the second 3D model.

According to some aspects, the method may include one or more of the following features (or any combination thereof). The method includes simulating a placement of the second 3D model on the first 3D model. The wearable device includes a head-mounted display device configured to project a display. The method includes receiving image data from an image sensor and generating the first 3D model based on the image data. The method includes computing a wearable fit value based on the plurality of contact points, the wearable fit value representing a level of wearable fit of the wearable device on the body part of the person. The method includes predicting, by the at least one ML model, at least one simulation parameter using at least one of the first 3D model or the second 3D model and computing a wearable fit value based on the plurality of contact points and the at least one simulation parameter, the wearable fit value representing a level of wearable fit of the wearable device on the body part of the person. The at least one simulation parameter may include skin elasticity. The at least one simulation parameter includes device slippage tolerance. The at least one simulation parameter may include tolerable contact pressure. The at least one simulation parameter may include nose shape.

According to an aspect, a computing system includes at least one processor and a non-transitory computer-readable medium storing executable instructions that when executed by the at least one processor cause the at least one processor to receive a first 3D model of at least a body part of a person, receive a second 3D model of a wearable device, predict, by at least one machine-learning (ML) model, a plurality of contact points between the first 3D model and the second 3D model and compute a wearable fit value based on the plurality of contact points, the wearable fit value representing a level of wearable fit of the wearable device on the body part of the person.

According to some aspects, the computing system may include one or more of the following features (or any combination thereof). The executable instructions include instructions that when executed by the at least one processor cause the at least one processor to predict, by the at least one ML model, at least one simulation parameter using at least one of the first 3D model or the second 3D model, wherein the wearable fit value is based on the plurality of contact points and the at least one simulation parameter. The at least one simulation parameter may include at least one of skin elasticity, device slippage tolerance, tolerable contact pressure, or nose shape. The wearable device includes a head-mounted display device configured to project a display, wherein the executable instructions include instructions that when executed by the at least one processor cause the at least one processor to compute a display fit value based on the plurality of contact points, the display fit value representing an amount of the display that can be viewed by the person. The first 3D model may be received over a network from a computing device. The executable instructions include instructions that when executed by the at least one processor cause the at least one processor to receive image data over a network from a computing device and generate the first 3D model based on the image data.

According to an aspect, a non-transitory computer-readable medium storing executable instructions that when executed by at least one processor cause the at least one processor to receive a first 3D model of at least a head of a person, receive a second 3D model of a head-mounted display device, predict, by at least one machine-learning (ML) model, a plurality of contact points between the first 3D model and the second 3D model, predict, by the at least one ML model, at least one simulation parameter, and compute a wearable fit value based on the plurality of contact points and the at least one simulation parameter, the wearable fit value representing a level of wearable fit of the head-mounted display device on the head of the person.

According to some aspects, the non-transitory computer-readable medium may include one of more of the following features (or any combination thereof). The at least one simulation parameter may include at least one of skin elasticity, device slippage tolerance, tolerable contact pressure, or nose shape. The head-mounted display device is configured to project a display, wherein the executable instructions include instructions that when executed by the at least one processor cause the at least one processor to compute a display fit value based on the plurality of contact points, the display fit value representing an amount of the display that can be viewed by the person. The executable instructions include instructions that when executed by the at least one processor cause the at least one processor to simulate a placement of the second 3D model on the first 3D model.

The details of one or more implementations are set forth in the accompanying drawings and the description below. Other features will be apparent from the description and drawings, and from the claims.

BRIEF DESCRIPTION OF THE DRAWINGS

FIG. 1B illustrates an example of a machine-learning (ML) model according to an aspect.

FIG. 1C illustrates an example of a ML model according to another aspect.

FIG. 3 illustrates a system for predicting contact points between 3D models according to an aspect.

DETAILED DESCRIPTION

Figure 1A:
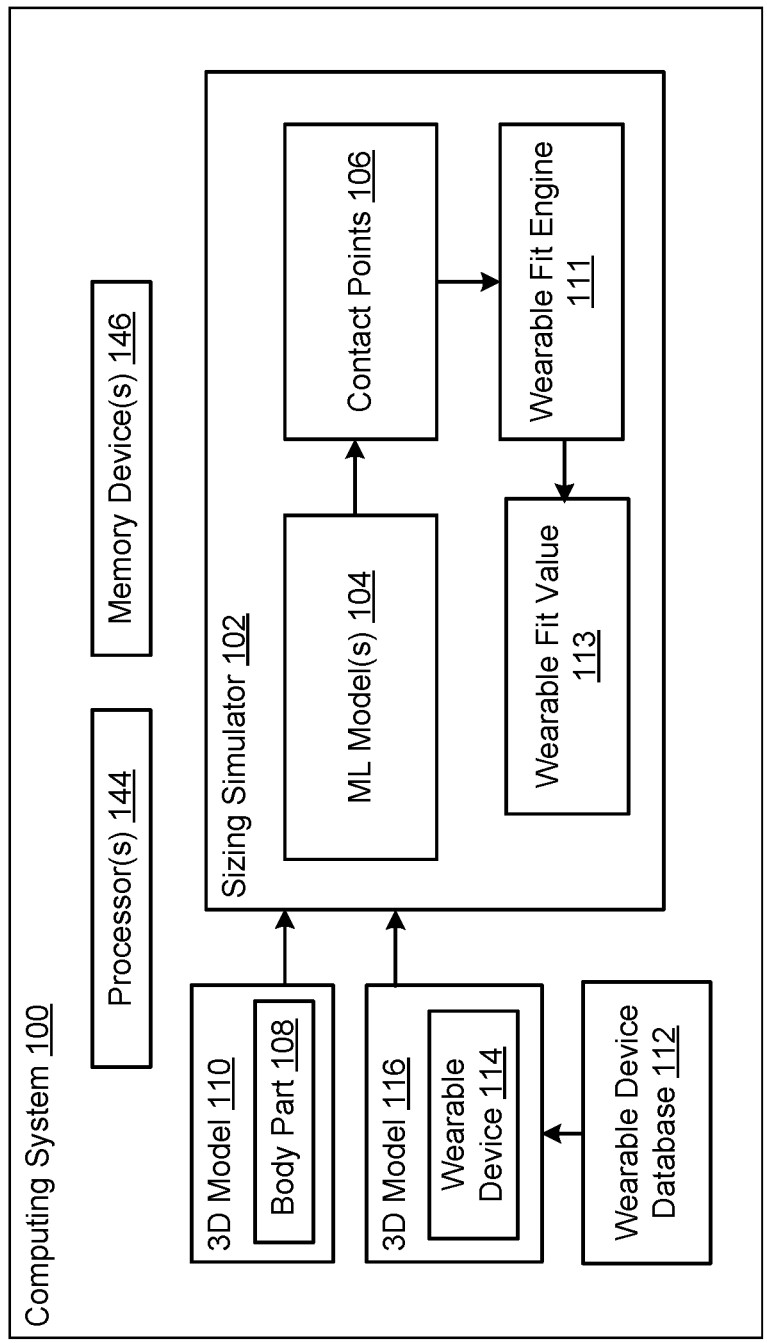
FIG. 1A illustrates a computing system for predicting contact points between three-dimensional (3D) models according to an aspect.

In order to determine a wearable fit, a simulator can simulate the placement of a wearable device on the relevant part of the person's body. However, performing a wearable fit evaluation for a number of wearable devices for a particular user may require a relatively large amount of computing resources, and, therefore, can be time consuming. In addition, in some examples, a simulator may use hard-coded (e.g., fixed) parameters having values that are the same across a number of users, but these parameters may vary among users, and, therefore, the accuracy of simulation may be reduced.

This disclosure relates to a sizing simulator having at least one machine-learning (ML) model that receives a first three-dimensional (3D) model associated with at least a body part of a person and a second 3D model associated with a wearable device, where the ML model predicts contact points between the first 3D model and the second 3D model. The contact points may be the coordinates in 3D space at which the second 3D model contacts the first 3D model when the wearable device is placed on the body part. The use of ML model(s) to predict the contact points may reduce the number of computation resources (e.g., processing power, memory, etc.) to evaluate a number of wearable devices for a particular user, thereby decreasing the amount of time for the wearable fit evaluation.

In some examples, the second 3D model is 3D image data of a head-mounted device (e.g., smartglasses, augmented reality (AR) headset, etc.). The ML model may predict the contact points between the head-mounted device and the person's head when the head-mounted device is placed on the person's head. For example, the contact points may be the points where the bridge portion of the smartglasses' frame contacts the bridge of the person's nose, the points where the arm portions of the smartglasses rest on the person's ears, and/or the points where the arm portions of the smartglasses contact the person's temples. Although the above example uses a head-mounted device (e.g., smartglasses), the embodiments discussed herein may predict the contact points between any type of wearable device and the relevant body part in which the wearable device is worn. For example, the wearable device may be earbuds, where the contact points are the points in which the earbuds contact the ear.

The sizing simulator may compute a wearable fit value based on the contact points, where the wearable fit value represents a level of wearable fit of the wearable device on the body part of the person. A wearable fit value above a threshold level may indicate that the wearable device can properly fit and be worn on the person represented by the first 3D model. The wearable fit value may be dependent on the locations of the contact points and whether (and how many) contact points are within one or more tolerance ranges. In some examples, as indicated above, the wearable device may include a head-mounted device, and the head-mounted device (e.g., smartglasses) is configured to project a display within a field of view of the user. In some examples, the sizing simulator computes a display fit value based on the contact points, where the display fit value represents an amount of the display that can be viewed by the person. A display fit value above a threshold level may indicate that the display projected by the smartglasses can be substantially viewed by the user.

The ML model may be configured to predict one or more simulation parameters that can be used in conjunction with the predicted contact points to compute the wearable fit value. For example, instead of using fixed parameter values that are the same across a number of users, the ML model may be trained to predict one or more simulation parameters such as skin elasticity, device slippage tolerance, tolerable contact pressure, and/or nose shape. The simulation parameters predicted by the ML model 404 may be used along with the predicted contact points to compute the wearable fit value.

FIGS. 1A through 1C illustrate a computing system 100 configured to predict contact points 106 between a 3D model 110 associated with at least a body part 108 of a person and a 3D model 116 associated with a wearable device 114 according to an aspect. The contact points 106 may be the coordinates in 3D space at which the 3D model 116 contacts the 3D model 110 when the wearable device 114 is placed on the body part 108.

A wearable device 114 may include one or more devices, where at least one of the devices is a display device capable of being worn on or in proximity to the skin of a person. The wearable device 114 may include a head-mounted display (HMD) device such as an optical head-mounted display (OHMD) device, a transparent heads-up display (HUD) device, an augmented reality (AR) device, or other devices such as goggles or headsets having sensors, display, and computing capabilities. However, the embodiments are not limited to head-mounted display devices, where the wearable device 114 may include any type of wearable device such as earbuds, watches, fitness trackers, cameras, body sensors, and/or any type of computing device that can be worn on the skin of a person.

The wearable device 114 may include smartglasses. Smartglasses is an optical head-mounted display device designed in the shape of a pair of eyeglasses. For example, smartglasses are glasses that add information (e.g., project a display) alongside what the wearer views through the glasses. For example, the wearable device 114 includes a display that is projected onto the field of view of the user. The display may include a liquid crystal display (LCD), a light-emitting diode (LED) display, an organic light-emitting display (OLED), an electro-phoretic display (EPD), or a micro-projection display adopting an LED light source. In some examples, the display may provide a transparent or semi-transparent display such that the user wearing the glasses can see images provided by the display but also information located in the field of view of the smartglasses behind the projected images. In some examples, the below description is explained in terms of smartglasses, but the embodiments may be applied to other types of wearable computing devices and/or combinations of mobile/wearable computing devices working together.

The computing system 100 includes one or more processors 144, which may be formed in a substrate configured to execute one or more machine executable instructions or pieces of software, firmware, or a combination thereof. The processors 144 can be semiconductor-based—that is, the processors can include semiconductor material that can perform digital logic. The computing system 100 can also include one or more memory devices 146. The memory devices 146 may include any type of storage device that stores information in a format that can be read and/or executed by the processor(s) 144. The memory device(s) 146 may store executable instructions that when executed by the processor(s) 144 cause the processor(s) 144 to perform any of the operations discussed herein. The memory devices 146 may store one or more databases (e.g., wearable device database 112). In some examples, the memory devices 146 which can store information received or generated by computing system 100. Also, the memory devices 146 may include applications and modules (e.g., sizing simulator 102, wearable fit engine 111, etc.) that, when executed by the processor(s) 144, perform the operations discussed herein. In some examples, the applications and modules may be stored in an external storage device and loaded into the memory devices 146.

In some examples, the computing system 100 includes one or more server computers. In some examples, the computing system 100 includes one or more client computers (e.g., desktop computers, laptops, tablets, smartphones, etc.). In some examples, the computing system 100 includes one or more server computers and one or more client computers. The computing system 100 includes a sizing simulator 102 configured to predict the contact points 106 and use the contact points to determine a wearable fit value 113 for one or more types of wearable devices 114. In some examples, the sizing simulator 102 is located at a server computer, where the sizing simulator 102 receives a 3D model 110 representing at least a body part 108 of a user. In some examples, the 3D model 110 can be generated at the client computer and transmitted to the server computer over a network. In some examples, the server computer can receive image data from the client computer, and the server computer can generate the 3D model 110, which is provided to the sizing simulator 102. In some examples, the sizing simulator 102 is located at the client computer.

The sizing simulator 102 includes one or more machine-learning (ML) models 104. A ML model 104 is a predictive model. In some examples, a ML model 104 includes a neural network. The ML model 104 may be an interconnected group of nodes, each node representing an artificial neuron. The nodes are connected to each other in layers, with the output of one layer becoming the input of a next layer. The ML model 104 transforms an input, received by the input layer, transforms it through a series of hidden layers, and produces an output via the output layer. Each layer is made up of a subset of the set of nodes. The nodes in hidden layers are fully connected to all nodes in the previous layer and provide their output to all nodes in the next layer. The nodes in a single layer function independently of each other (i.e., do not share connections). Nodes in the output provide the transformed input to the requesting process. In some examples, the ML model 104 is a convolutional neural network, which is a neural network that is not fully connected. Convolutional neural networks therefore have less complexity than fully connected neural networks. Convolutional neural networks can also make use of pooling or max-pooling to reduce the dimensionality (and hence complexity) of the data that flows through the neural network and thus this can reduce the level of computation required. This makes computation of the output in a convolutional neural network faster than in neural networks.

FIG. 1B illustrates a ML model 104 (e.g., a neural network) that is fully connected according to an aspect. The ML model 104 includes a set of computational processes for receiving a set of inputs 135 (e.g., input values) and generating a set of outputs 136 (e.g., output values). In some examples, each output value of the set of outputs 136 may represent a contact point 106 and the input values may represent the 3D model 110 and the 3D model 116 (or features extracted from the 3D model 110 and the 3D model 116). The ML model 104 includes a plurality of layers 129, where each layer 129 includes a plurality of neurons 131. The plurality of layers 129 may include an input layer 130, one or more hidden layers 132, and an output layer 134. In some examples, each output of the output layer 134 represents a possible prediction (e.g., contact points 106). In some examples, the output of the output layer 134 with the highest value represents the contact points 106.

In some examples, the ML model 104 is a deep neural network (DNN). For example, a deep neural network (DNN) may have one or more hidden layers 132 disposed between the input layer 130 and the output layer 134. However, the ML model 104 may be any type of artificial neural network (ANN) including a convolution neural network (CNN). The neurons 131 in one layer 129 are connected to the neurons 131 in another layer via synapses 138. For example, each arrow in FIG. 1B may represent a separate synapse 138. Fully connected layers 129 (such as shown in FIG. 1B) connect every neuron 131 in one layer 129 to every neuron in the adjacent layer 129 via the synapses 138.

Each synapse 138 is associated with a weight. A weight is a parameter within the ML model 104 that transforms input data within the hidden layers 132. As an input enters the neuron 131, the input is multiplied by a weight value and the resulting output is either observed or passed to the next layer in the ML model 104. For example, each neuron 131 has a value corresponding to the neuron's activity (e.g., activation value). The activation value can be, for example, a value between 0 and 1 or a value between −1 and +1. The value for each neuron 131 is determined by the collection of synapses 138 that couple each neuron 131 to other neurons 131 in a previous layer 129. The value for a given neuron 131 is related to an accumulated, weighted sum of all neurons 131 in a previous layer 129. In other words, the value of each neuron 131 in a first layer 129 is multiplied by a corresponding weight and these values are summed together to compute the activation value of a neuron 131 in a second layer 129. Additionally, a bias may be added to the sum to adjust an overall activity of a neuron 131. Further, the sum including the bias may be applied to an activation function, which maps the sum to a range (e.g., zero to 1). Possible activation functions may include (but are not limited to) rectified linear unit (ReLu), sigmoid, or hyperbolic tangent (TanH).

FIG. 1C illustrates a ML model 104 that is partially connected. For example, similar to FIG. 1B, the ML model 104 includes a set of computational processes for receiving a set of inputs 135 (e.g., input values) and generating a set of outputs 136 (e.g., output values). Also, the ML model 104 includes a plurality of layers 129, where each layer 129 includes a plurality of neurons 131, and the layers 129 include an input layer 130, one or more hidden layers 132, and an output layer 134. The neurons 131 in one layer 129 are connected to neurons 131 in an adjacent layer 129 via the synapses 138. However, unlike FIG. 1B, the ML model 104 is not fully connected, where every neuron 131 in one layer 129 is not connected to every neuron in the adjacent layer 129 via the synapses 138.

Referring back to FIG. 1A, the sizing simulator 102 may receive a 3D model 110 associated with at least a body part 108 of a person. In some examples, the sizing simulator 102 may receive the 3D model 110 over a network from a client computer. In some examples, the computing system 100 is configured to generate the 3D model 110 based on image data received over the network from a client computer. For example, a user may use the camera on her computing device to capture one or more images, and these images may be used to create the 3D model 110. In some examples, the user's computer device includes a depth sensor, and the 3D model 110 is generated by the depth sensor. In some examples, image data is captured by a sensor system (e.g., a camera rig) having multiple cameras and sensors, and the 3D model 110 is generated by the sensor system. In some examples, the 3D model 110 is obtained from a memory device 146.

The 3D model 110 includes 3D image data of at least a body part of a person. In some examples, the 3D model 110 includes 3D image data of at least a portion of a person. In some examples, the 3D model 110 includes a set of 3D points. In some examples, the 3D model 110 includes a point cloud. In some examples, the 3D model 110 includes a surface mesh. In some examples, the 3D model 110 includes image data of at least a portion of a person in three dimensions (e.g., height, width, depth) (e.g., in contrast to a 2D image that has height and width but no depth). In some examples, the 3D model 110 includes image data having depth values. In some examples, the image data of the 3D model 110 includes grayscale image data. In some examples, the image data of the 3D model 110 includes red-green-blue (RGB) data. In some examples, in the case of head-mounted display devices, the body part includes at least a head of a person. In some examples, in the case of earbuds, the body part includes at least an ear of a person. In some examples, the case of smartwatches, the body part includes at least the arm or wrist of the person.

The sizing simulator 102 may receive a 3D model 116 associated with a wearable device 114. In some examples, the sizing simulator 102 receives a 3D model 116 from a wearable device database 112. The wearable device database 112 may store a plurality of 3D models 116 that correspond to a plurality of wearable devices 114. Each 3D model 116 corresponds to a separate wearable device 114. A 3D model 116 includes 3D image data representing a particular wearable device 114. In some examples, the 3D model 116 includes a set of 3D points. In some examples, the 3D model 116 includes a point cloud. In some examples, the 3D model 116 includes a surface mesh. In some examples, the 3D model 116 includes image data of a wearable device 114 in three dimensions (e.g., height, width, depth) (e.g., in contrast to a 2D image that has height and width but no depth). In some examples, the 3D model 116 is generated from multiple 2D images. In some examples, the 3D model 116 is generated from multiple 2D images using one or more ML, models. In some examples, the 3D model 116 includes image data having depth values. In some examples, the image data of the 3D model 116 includes grayscale image data. In some examples, the image data of the 3D model 116 includes red-green-blue (RGB) data. In some examples, the 3D models 116 are different types (e.g., models, SKUs) of smartglasses or other category of wearable devices. For example, the sizing simulator 102 may select one 3D model 116 corresponding to a particular type of wearable device, which is used to predict the contact points 106 with the 3D model 110 and the contact points 106 are used to compute the wearable fit value 113. Then, the sizing simulator 102 may select another 3D model 116 corresponding to another wearable device design, which is used to predict the contact points 106 with the 3D model 110 and the contact points 106 are used to compute the wearable fit value 113. The sizing simulator 102 may perform the same evaluation for other 3D models 116 in the wearable device database 112 and use the wearable fit values 113 to identify (and/or rank) the wearable devices 114 according to the best wearable fit for the particular person represented by the 3D model 110.

The sizing simulator 102 may provide the 3D model 110 and the 3D model 116 as inputs to the ML, model 104 to predict the contact points 106. The ML model 104 is configured to predict the contact points 106 based on the 3D model 110 and the 3D model 116. The contact points 106 may be the coordinates in 3D space at which the 3D model 116 contacts the 3D model 110 when the wearable device 114 is placed on the body part 108 (e.g., how the wearable device 114 can be worn on the body part 108). The use of the ML model 104 to predict the contact points 106 may reduce the number of computation resources (e.g., processing power, memory, etc.) to evaluate a number of wearable devices 114 for a particular user, thereby decreasing the amount of time for the wearable fit evaluation.

In some examples, the 3D model 116 is 3D image data of a head-mounted device (e.g., smartglasses, augmented reality (AR) headset, etc.). The ML, model 104 may predict the contact points 106 between the head-mounted device and the person's head when the head-mounted device is placed on the person's head. For example, the contact points 106 may be the points where the bridge portion of the smartglasses' frame contacts the bridge of the person's nose, the points where the arm portions of the smartglasses rest on the person's ears, and/or the points where the arm portions of the smartglasses contact the person's temples. In some examples, the contact points 106 include the points that the smartglasses contact a person's cheek or brow. In some examples, the contact points 106 include the points that the smartglasses contact a person's eyelashes. Although the above example uses a head-mounted device (e.g., smartglasses), the embodiments discussed herein may predict the contact points between any type of wearable device 114 and the relevant body part 108 in which the wearable device 114 is worn. For example, the wearable device 114 may be earbuds, where the contact points are the points in which the earbuds contact the ear.

The sizing simulator 102 includes a wearable fit engine 111 configured to compute a wearable fit value 113 based on the contact points 106, where the wearable fit value 113 represents a level of wearable fit of the wearable device 114 on the body part 108 of the person. In some examples, a wearable fit value 113 above a threshold level may indicate that the wearable device 114 can properly fit and be worn on the person represented by the 3D model 110. The wearable fit value 113 may be dependent on the locations of the contact points 106 and whether (and how many) contact points 106 are within one or more tolerance ranges. In some examples, the wearable fit value 113 may also indicate a person's comfort. For example, a larger surface area of proper contact points may imply a better wearable fit (therefore having a higher wearable fit value 113) For example, if some of the contact points 106 that define the locations the bridge portion of the smartglasses' frame contacts the bridge of the person's nose are not within a tolerance range that define the tolerance range for that contact area, the wearable fit value 113 may have a smaller value. In some examples, the ML model 104 computes the wearable fit value 113. For example, by using a ML model 104 to compute the wearable fit value 113, the wearable fit value computation may also account for properties of the person's face.

In some examples, the wearable fit engine 111 is configured to compute a single wearable fit value 113. In some examples, the wearable fit engine 111 is configured to compute multiple wearable fit values 113. In some examples, the wearable fit value 113 represents an overall level of wearable fit between the wearable device 114 and the body part 108. In some examples, the wearable fit value 113 may represent a certain aspect of how at least a portion of the wearable device 114 fits on a portion of the body part 108. For example, one or more wearable fit values 113 may be associated with different areas of the frame such as how tight the contact is at the temple arms, how symmetrical the frame sits on the face, where the pupil falls with respect to the lens, and/or the contact the nose bridge makes with the nose, etc. These aspects may have a value quantifying how good a fit is, and in some examples, can be combined to form one overall wearable fit value.

The sizing simulator 102 may select another 3D model 116 from the wearable device database 112. The sizing simulator 102 may input this newly selected 3D model 116 along with the same 3D model 110 that was used in the previous iteration to compute the contact points 106. The wearable fit engine 111 may use the contact points 106 to compute the wearable fit value 113. The sizing simulator 102 may repeat these operations for the other 3D models 116 in the wearable device database 112. In some examples, the sizing simulator 102 may identify those wearable devices 114 having wearable fit values 113 above a threshold level. In some examples, the sizing simulator 102 may rank the wearable devices 114 based on their corresponding wearable fit values 113. For example, if a particular type of wearable device 114 includes three models, the sizing simulator 102 may compute a first wearable fit value 113 for a first wearable device 114, a second wearable fit value 113 for a second wearable device 114, and a third wearable fit value 113 for a third wearable device 114. In some examples, the sizing simulator 102 may rank the wearable devices 114 by their corresponding wearable fit values 113 and identify which of those wearable devices 114 have wearable fit values 113 above the threshold level.

Figure 2:
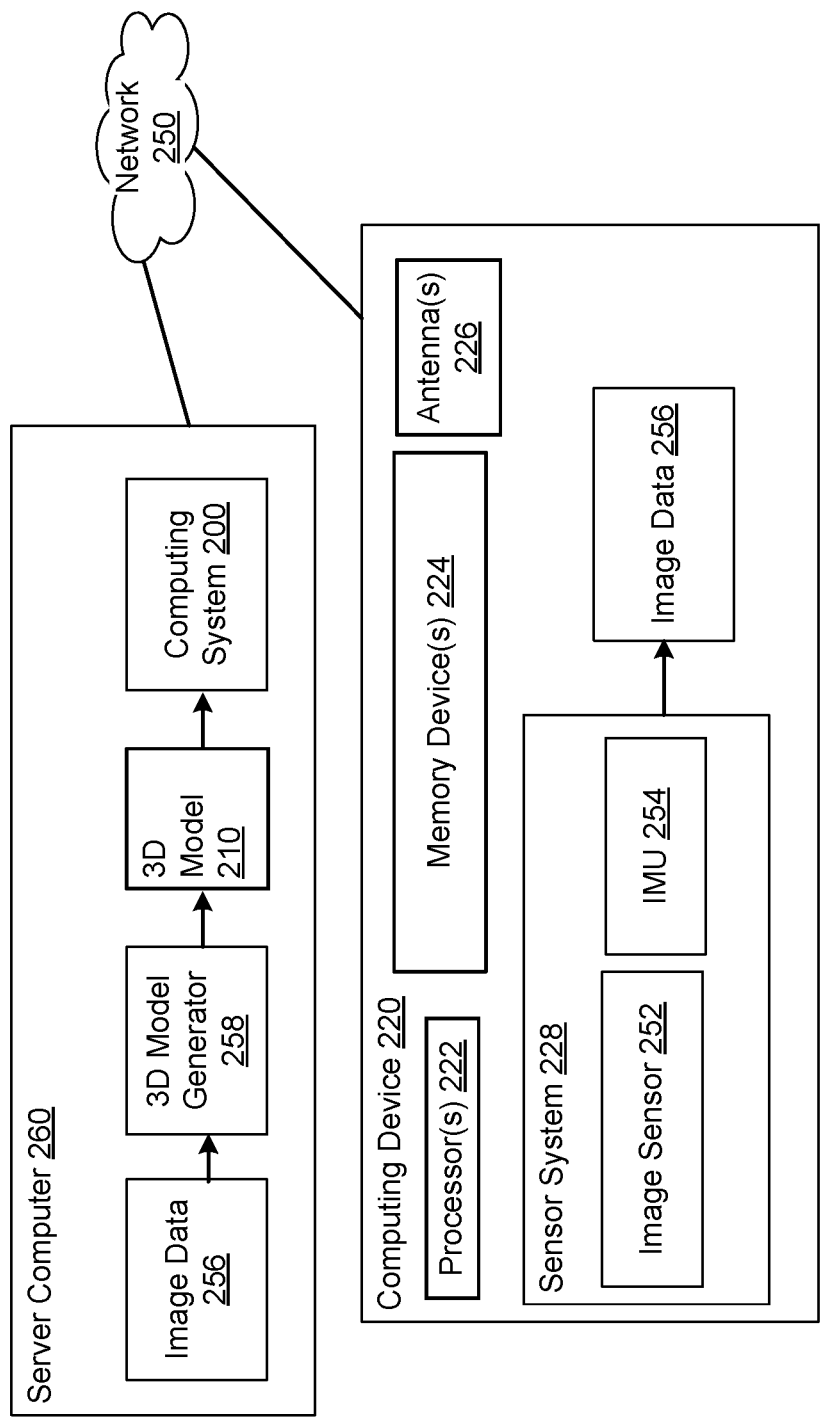
FIG. 2 illustrates a system for predicting contact points between 3D models according to an aspect.

FIG. 2 illustrates a system for predicting contact points between 3D models using a ML model according to an aspect. The system includes a server computer 260 and a computing device 220, where the computing device 220 is connected to the server computer 260 via a network 250. The server computer 260 may be computing devices that take the form of a number of different devices, for example a standard server, a group of such servers, or a rack server system. In some examples, the server computer 260 is a single system sharing components such as processors and memories. The network 250 may include the Internet and/or other types of data networks, such as a local area network (LAN), a wide area network (WAN), a cellular network, satellite network, or other types of data networks. The network 250 may also include any number of computing devices (e.g., computer, servers, routers, network switches, etc.) that are configured to receive and/or transmit data within network 250.

The computing device 220 may include any type of client computing device such as desktop, laptop, tablet, smartphone, etc. The computing device 220 may include one or more processors 222, which may be formed in a substrate configured to execute one or more machine executable instructions or pieces of software, firmware, or a combination thereof. The processor(s) 222 can be semiconductor-based—that is, the processors can include semiconductor material that can perform digital logic. The computing device 220 includes one or more memory devices 224. The memory devices 224 may include a main memory that stores information in a format that can be read and/or executed by the processors 222. The computing device 220 may include one or more antennas 226 to enable communication with other computing device(s) and/or the server computer 260 via the network 250.

The computing device 220 includes a sensor system 228. The sensor system 228 includes an image sensor 252. In some examples, the sensor system 228 includes multiple image sensors 252. The sensor system 228 may include an inertial motion unit (IMU) 254. The IMU 254 may detect motion, movement, and/or acceleration of the computing device 220. The IMU 254 may include various different types of sensors such as, for example, an accelerometer, a gyroscope, a magnetometer, and other such sensors. The sensor system 228 may include other types of sensors such as a light sensor, an audio sensor, a distance and/or proximity sensor, a contact sensor such as a capacitive sensor, a timer, and/or other sensors and/or different combination(s) of sensors.

The sensor system 228 is configured to generate image data 256. For example, a user may use the computing device 220 to cause the sensor system 228 to capture one or more images (e.g., the image data 256). In some examples, the computing device 220 transmits the image data 256 to the server computer 260 via the network 250. The server computer 260 may include a 3D model generator 258 configured to receive the image data 256 and generate a 3D model 210 based on the image data 256. The 3D model 210 is provided to a computing system 200 to evaluate a number of wearable devices that can be worn by the user. The 3D model 210 may be an example of the 3D model 110 of FIGS. 1A through 1C and may include any of the details discussed herein. The computing system 200 may be an example of the computing system 100 of FIGS. 1A through 1C and may include any of the details discussed herein. In some examples, the server computer 260 is configured to transmit the results of the evaluation to the computing device 220. For example, the computing device 220 may receive an identification of which wearable devices the user is likely to fit.

FIG. 3 illustrates a system for predicting contact points between 3D models using a ML model according to an aspect. Similar to FIG. 2, the system of FIG. 3 includes a server computer 360 and a computing device 320, where the computing device 320 is connected to the server computer 360 via a network 350. The system of FIG. 3 may be an example of the system of FIG. 2 and may include any of the details discussed with reference to those figures.

The computing device 320 may include one or more processors 322, one or more memory devices 324, one or more antennas 326 to enable communication with other computing device(s) and/or the server computer 360 via the network 350, and a sensor system 328. The sensor system 328 includes an image sensor 252 and an inertial motion unit (IMU) 354. In some examples, the sensor system 328 is configured to generate a 3D model 310. For example, instead of the server computer 360 generating a 3D model based on image data received over the network, the sensor system 328 may have one or more image sensors 352 that are configured to generate a 3D model 310. In some examples, the image sensor 352 includes a pulsed laser sensor (e.g., a LiDAR sensor) or depth camera. The 3D model 310 is provided to a computing system 300 to evaluate a number of wearable devices that can be worn by the user. The 3D model 310 is an example of the 3D model 110 of FIGS. 1A through 1C and may include any of the details discussed herein. The computing system 300 of FIG. 3 may be an example of the computing system 100 of FIGS. 1A through 1C and may include any of the details discussed herein. In some examples, the server computer 360 is configured to transmit the results of the evaluation to the computing device 320. For example, the computing device 320 may receive an identification of which wearable devices the user is likely to fit.

FIGS. 4A through 4E illustrate a computing system 400 configured to predict contact points 406 between a 3D model 410 associated with at least a head of a person and a 3D model 416 associated with a head-mounted display device 414 according to an aspect. The contact points 406 may be the coordinates in 3D space at which the 3D model 416 contacts the 3D model 410 when the head-mounted display device 414 is placed on the user's head. The computing system 400 of FIGS. 4A through 4E may be an example of the computing system 100 of FIGS. 1A through 1C and may include any of the details discussed with reference to those figures. The computing system 400 may be applicable to head-mounted display devices 414. Although some of the description of FIGS. 4A through 4E refers to smartglasses, it is understood that the principles discussed herein may be applicable to any type of head-mounted display devices 414.

Figure 4A:
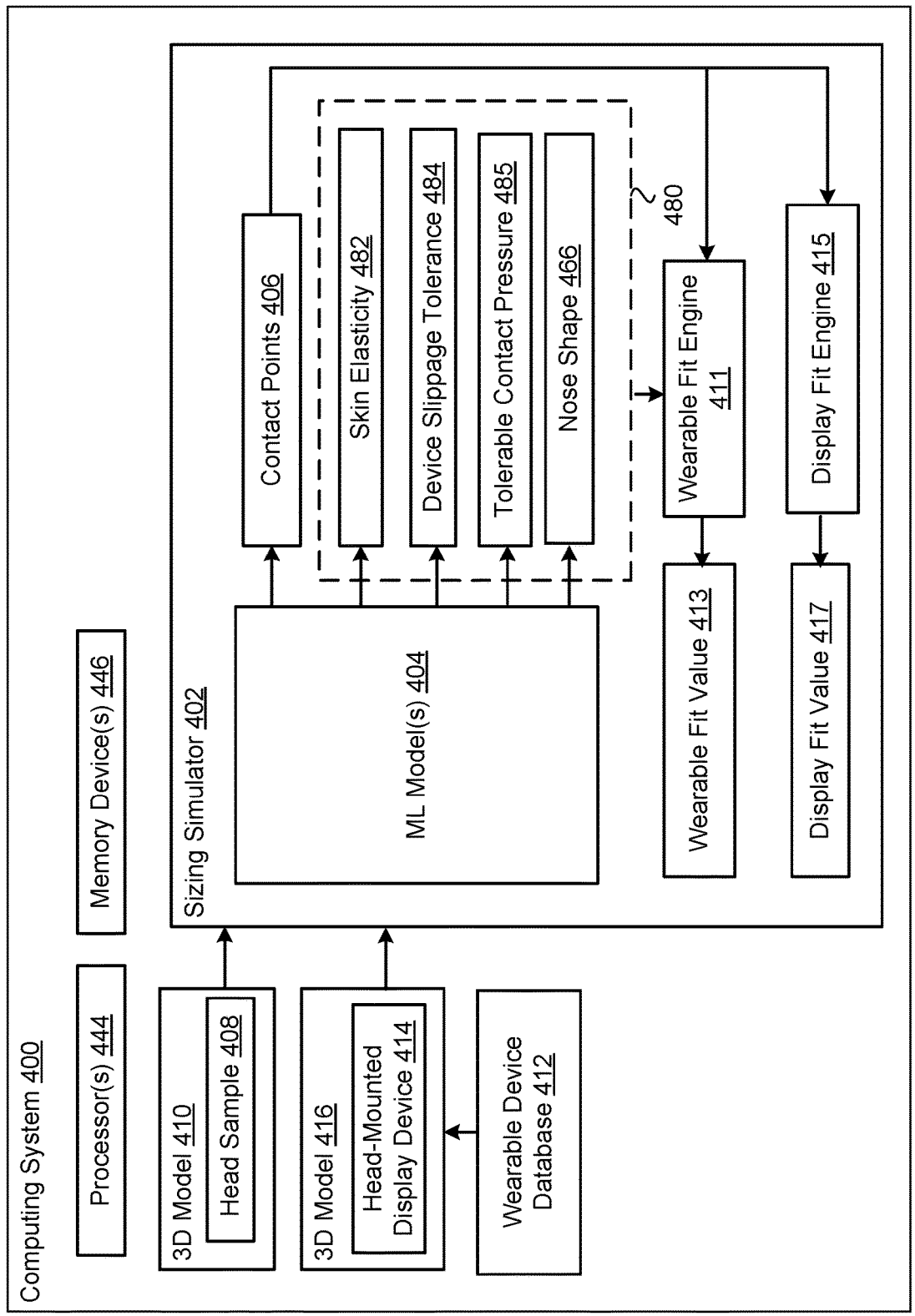
FIG. 4A illustrates a computing system for predicting contact points between 3D models according to an aspect.
Figure 4B:
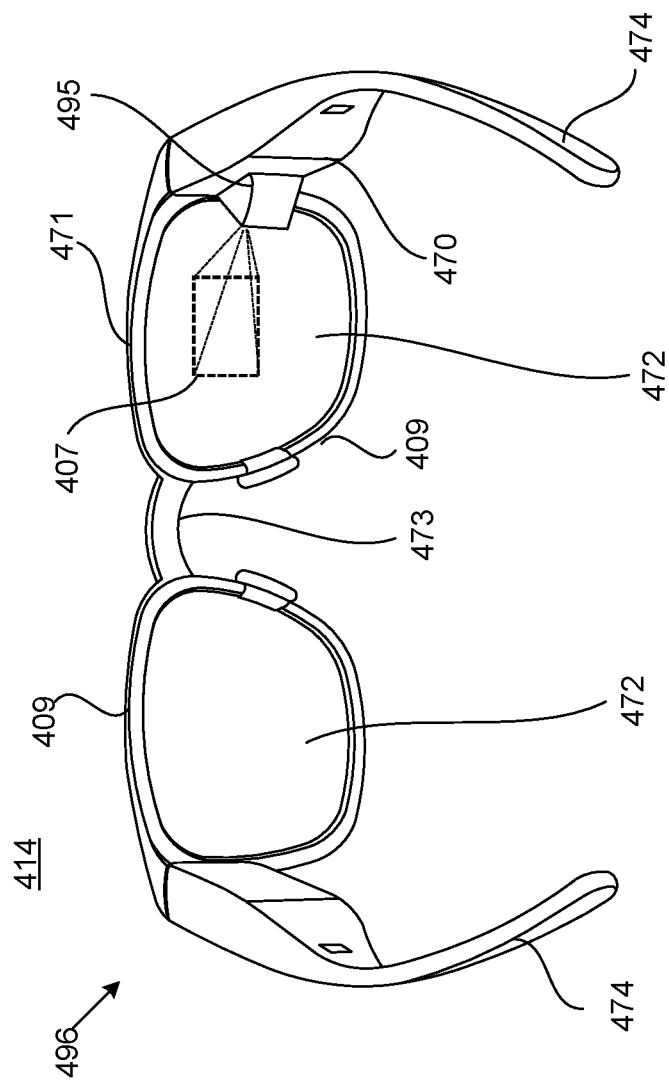
FIG. 4B illustrates an example of a head-mounted display device according to an aspect.

In some examples, referring to FIG. 4B, the head-mounted display device 414 may include smartglasses 496. Smartglasses 496 are glasses that add information (e.g., project a display 407) alongside what the wearer views through the glasses. For example, the smartglasses 496 may include a display device 495 configured to project the display 407. In some examples, the display device 495 may include a see-through near-eye display. For example, the display device 495 may be configured to project light from a display source onto a portion of teleprompter glass functioning as a beamsplitter seated at an angle (e.g., 30-45 degrees). The beamsplitter may allow for reflection and transmission values that allow the light from the display source to be partially reflected while the remaining light is transmitted through. Such an optic design may allow a user to see both physical items in the world, for example, through the lenses 472, next to content (for example, digital images, user interface elements, virtual content, and the like) generated by the display device 495. In some implementations, waveguide optics may be used to depict content on the display device 495.

In some examples, instead of projecting information, the display 407 is an in-lens micro display. In some examples, the display 407 is referred to as an eye box. In some examples, smartglasses 496 (e.g., eyeglasses or spectacles), are vision aids, including lenses 472 (e.g., glass or hard plastic lenses) mounted in a frame 471 that holds them in front of a person's eyes, typically utilizing a bridge portion 473 over the nose, and arm portions 474 (e.g., temples or temple pieces) which rest over the ears. The bridge portion 473 may connect rim portions 409 of the frame 471. The smartglasses 496 include an electronics component 470 that includes circuitry of the smartglasses 496. In some examples, the electronics component 470 is included or integrated into one of the arm portions 474 (or both of the arm portions 474) of the smartglasses 496.

The smartglasses 496 can also include an audio output device (such as, for example, one or more speakers), an illumination device, a sensing system, a control system, at least one processor, and an outward facing image sensor, or camera. In some examples, the smartglasses 496 may include a gaze tracking device including, for example, one or more sensors, to detect and track eye gaze direction and movement. Data captured by the sensor(s) may be processed to detect and track gaze direction and movement as a user input. In some examples, the sensing system may include various sensing devices and the control system may include various control system devices including, for example, one or more processors operably coupled to the components of the control system. In some implementations, the control system may include a communication module providing for communication and exchange of information between the wearable computing device and other external devices.

Referring back to FIG. 4A, the computing system 400 includes one or more processors 444 and one or more memory devices 446. The memory device(s) 446 may store executable instructions that when executed by the processor(s) 444 cause the processor(s) 144 to perform any of the operations discussed herein.

The sizing simulator 402 includes one or more machine-learning (ML) models 404. A ML model 404 is a neural network. The ML model 404 may be an interconnected group of nodes, each node representing an artificial neuron. The nodes are connected to each other in layers, with the output of one layer becoming the input of a next layer. The ML model 404 transforms an input, received by the input layer, transforms it through a series of hidden layers, and produces an output via the output layer. Each layer is made up of a subset of the set of nodes. The nodes in hidden layers are fully connected to all nodes in the previous layer and provide their output to all nodes in the next layer. The nodes in a single layer function independently of each other (i.e., do not share connections). Nodes in the output provide the transformed input to the requesting process. In some examples, the ML model 404 is a convolutional neural network, which is a neural network that is not fully connected. Convolutional neural networks therefore have less complexity than fully connected neural networks. Convolutional neural networks can also make use of pooling or max-pooling to reduce the dimensionality (and hence complexity) of the data that flows through the neural network and thus this can reduce the level of computation required. This makes computation of the output in a convolutional neural network faster than in neural networks. In some examples, the ML model 404 is the ML model 104 of FIG. 1A through 1C.

The sizing simulator 402 may receive a 3D model 410 associated with a head sample 408 of a person according to any of the previous examples. In some examples, the sizing simulator 402 may receive the 3D model 410 over a network from a client computer. In some examples, the computing system 400 is configured to generate the 3D model 410 based on image data received over the network from a client computer. For example, a user may use the camera on her computing device to capture one or more images, and these images may be used to create the 3D model 410. In some examples, the user's computer device includes a depth sensor, and the 3D model 410 is generated by the depth sensor. In some examples, image data is captured by a sensor system (e.g., a camera rig) having multiple cameras and sensors, and the 3D model 410 is generated by the sensor system. In some examples, the 3D model 410 is obtained from a memory device 446.

The sizing simulator 402 may receive a 3D model 416 associated with a head-mounted display device 414 (e.g., the smartglasses 496 of FIG. 4B). In some examples, the sizing simulator 102 receives a 3D model 416 from a wearable device database 412. The wearable device database 412 may store a plurality of 3D models 416 that correspond to a plurality of head-mounted display devices 414. Each 3D model 416 corresponds to a separate head-mounted display device 414. A 3D model 416 includes 3D image data representing a particular head-mounted display device 414. In some examples, the 3D models 416 are different types (e.g., models, SKUs) of smartglasses 496.

For example, the sizing simulator 402 may select one 3D model 416 corresponding to a particular type of head-mounted display device 414, which is used to predict the contact points 406 with the 3D model 410 and the contact points 406 are used (at least in part) to predict a wearable fit value 413 and a display fit value 417. Then, the sizing simulator 402 may select another 3D model 116 corresponding to another head-mounted display device design, which is used to predict the contact points 406 with the 3D model 410 and the contact points 406 are used to compute a wearable fit value 413 and a display fit value 417. The sizing simulator 102 may perform the same evaluation for other 3D models 416 in the wearable device database 412 and use the wearable fit values 413 and/or the display fit values 417 to identify (and/or rank) the head-mounted display devices 414 according to the best wearable/display fit for the particular person represented by the 3D model 410.

The sizing simulator 402 may provide the 3D model 410 and the 3D model 416 as inputs to the ML model 404 to predict the contact points 406. The ML model 404 is configured to predict the contact points 406 based on the 3D model 410 and the 3D model 416. The contact points 406 may be the coordinates in 3D space at which the 3D model 416 contacts the 3D model 410 when the head-mounted display device 414 is placed on the head of the person (e.g., how the smartglasses 496 can be worn on the head). The use of the ML model 404 to predict the contact points 406 may reduce the number of computation resources (e.g., processing power, memory, etc.) to evaluate a number of head-mounted display devices 414 for a particular user, thereby decreasing the amount of time for the wearable/display fit evaluation. In some examples, the contact points 406 may be the points where the bridge portion 473 of the smartglasses' frame 471 contacts the bridge of the person's nose, the points where the arm portions 474 of the smartglasses rest on the person's ears, and/or the points where the arm portions 474 of the smartglasses contact the person's temples.

Figure 4C:
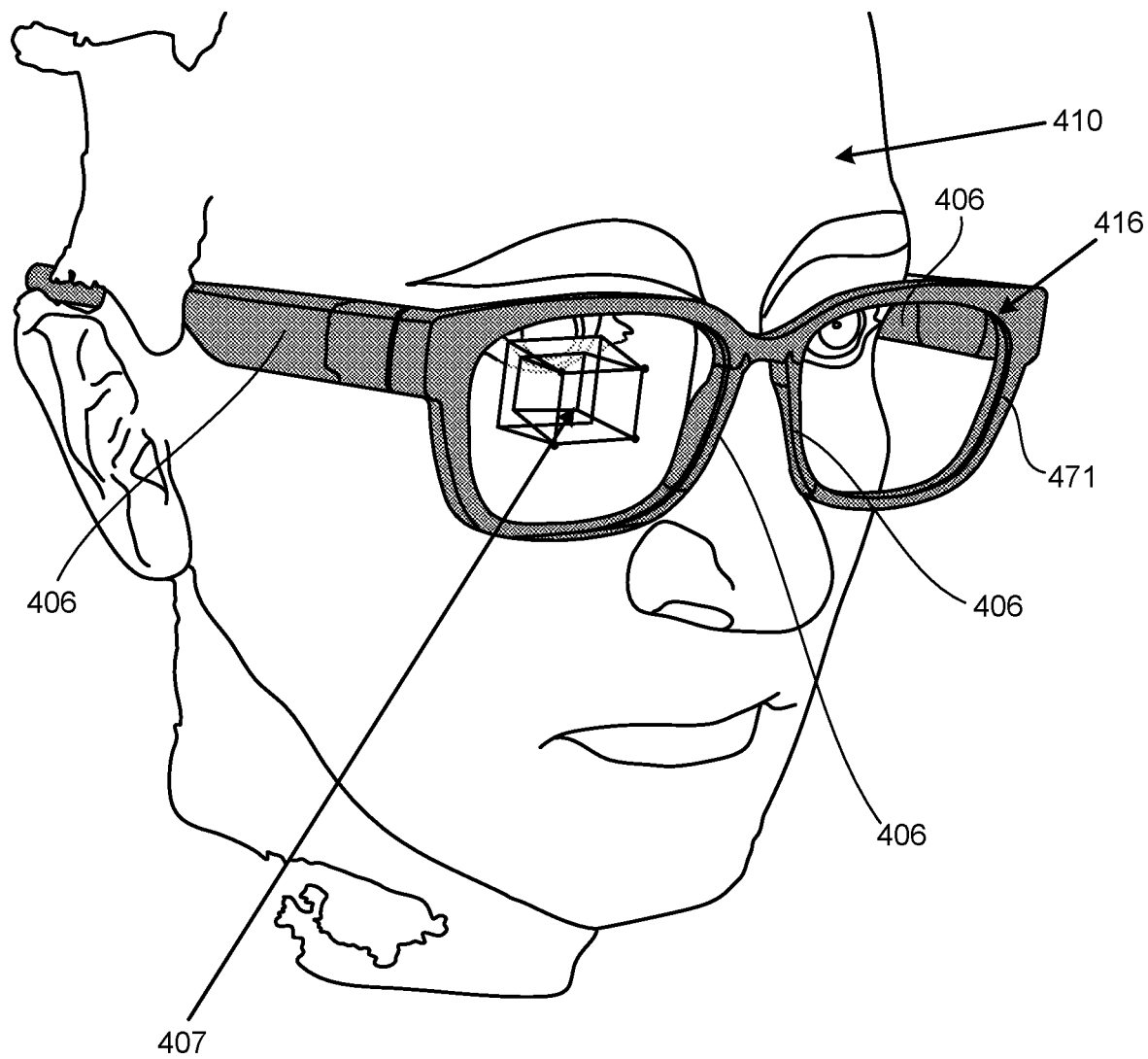
FIGS. 4C through 4E illustrate examples of simulating placement of a head-mounted display device on a head sample according to an aspect.
Figure 4D:
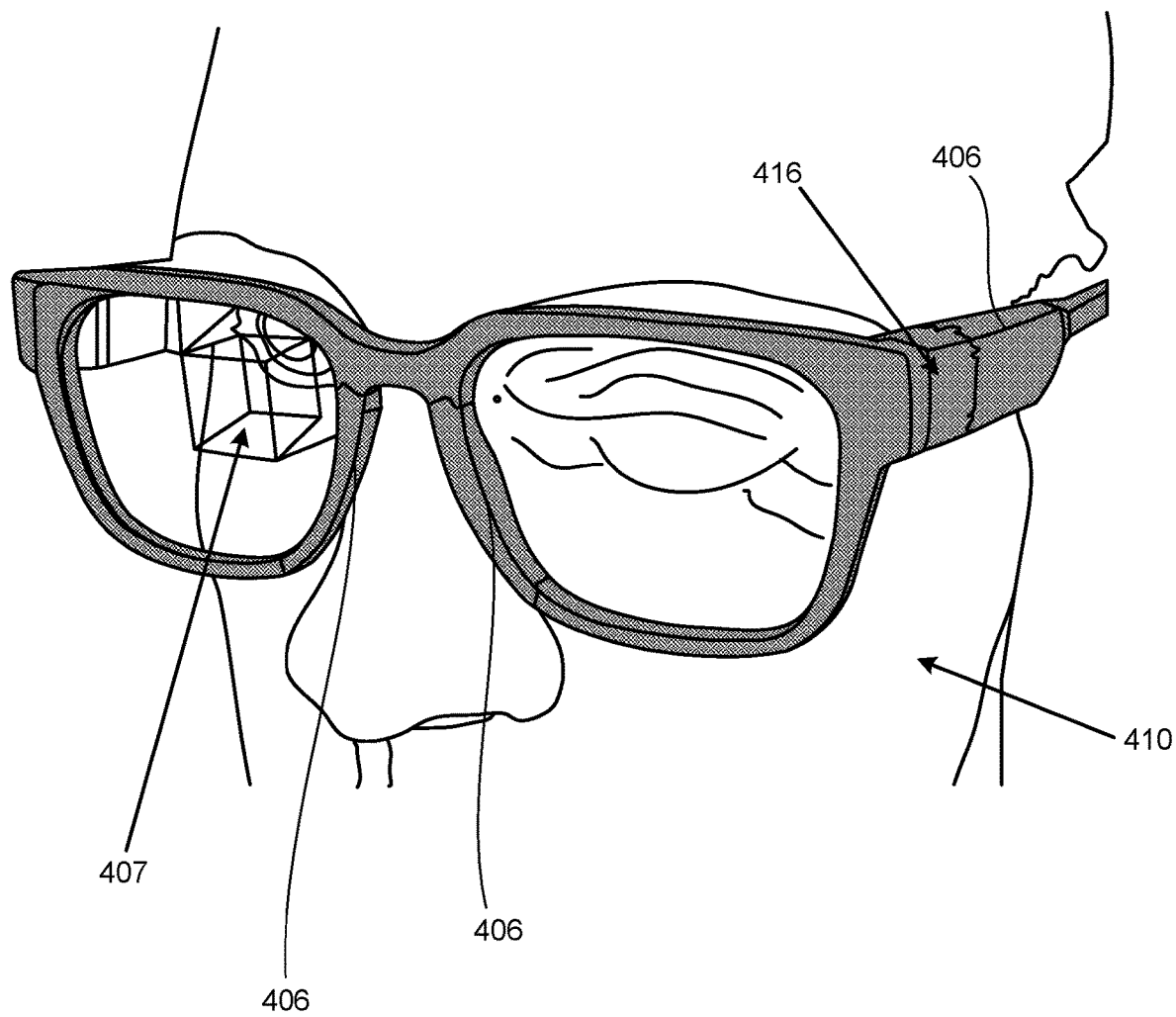
Figure 4E:
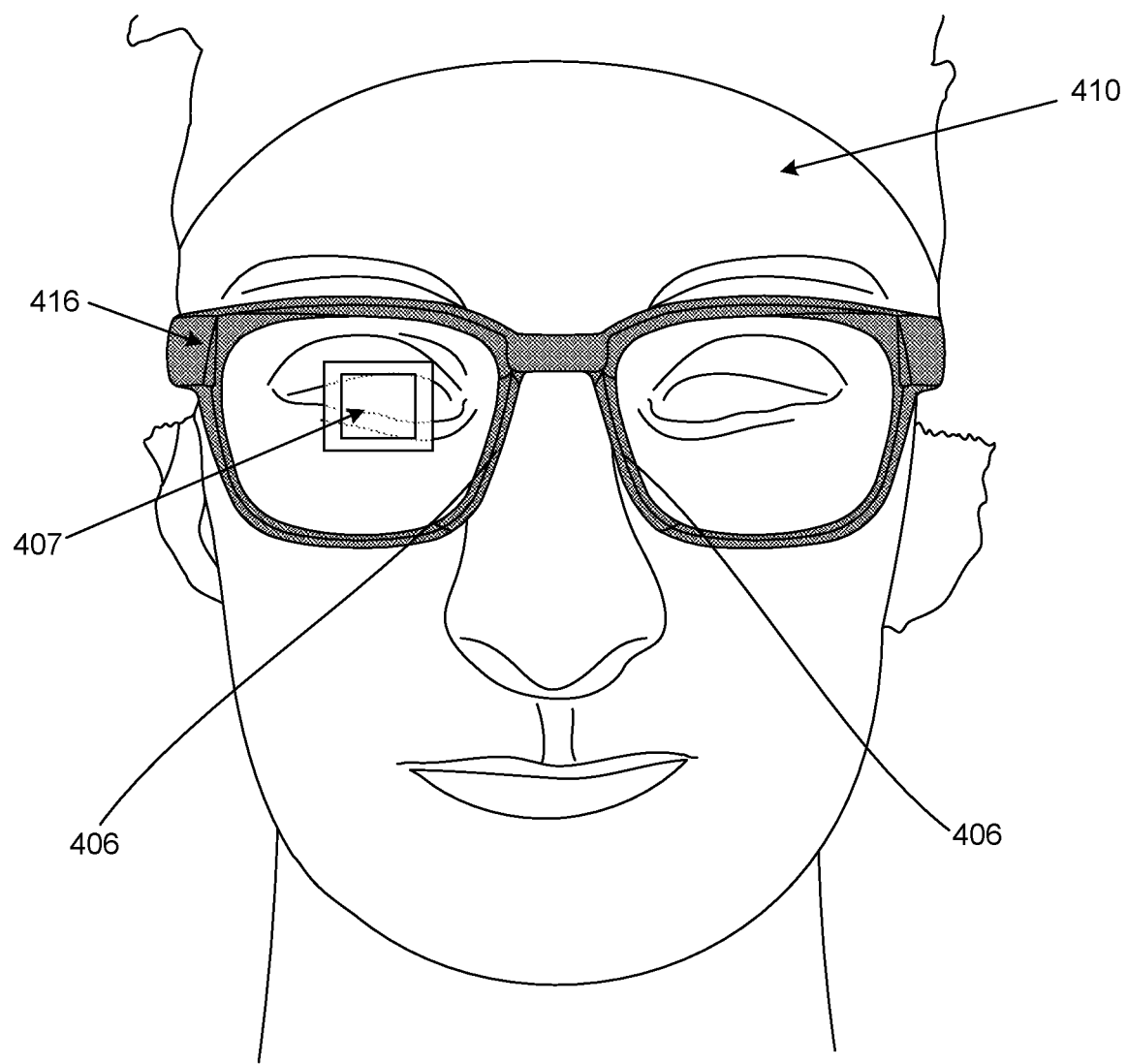

In some examples, the sizing simulator 402 is configured to simulate the placement of the 3D model 416 on the 3D model 410, as shown in FIGS. 4C through 4E. FIGS. 4C through 4E also illustrate the predicted contact points 406. In some examples, the sizing simulator 402 may receive the 3D model 410 and the 3D model 416 and then position the 3D model 416 on the 3D model 410 such that the 3D model 416 and the 3D model 410 contact each other. In some examples, the sizing simulator 402 may position the smartglasses 496 on the face of the head sample 408 where the frames 471 contact the nose and fit behind the ears. In some examples, the smartglasses 496 are positioned a certain distance away from the face, and the sizing simulator 402 may iteratively perform the following operations until convergence: tilt the smartglasses 496 to rest on the ears, bend the smartglasses 496 to clear the temples, move the smartglasses 496 to the nose, and recenter the smartglasses 496 to maintain contact with both sides of the nose.

Referring back to FIG. 4A, the sizing simulator 402 includes a wearable fit engine 411 configured to compute a wearable fit value 413 based on the contact points 406, where the wearable fit value 413 represents a level of wearable fit of the head-mounted display device 414 on the head of the person. In some examples, a wearable fit value 413 above a threshold level may indicate that the head-mounted display device 414 can properly fit and be worn on the person represented by the 3D model 410. The wearable fit value 413 may be dependent on the locations of the contact points 406 and whether (and how many) contact points 406 are within one or more tolerance ranges. For example, if some of the contact points 406 that define the locations the bridge portion 473 of the smartglasses' frame contacts the bridge of the person's nose are not within a tolerance range that define the tolerance range for that contact area, the wearable fit value 413 may have a smaller value.

In some examples, the ML model 404 may be configured to predict one or more simulation parameters 480 that can be used in conjunction with the predicted contact points 406 to determine the wearable fit value 413. For example, the wearable fit engine 411 may receive the predicted contact points 406 and one or more simulation parameters 480 and compute the wearable fit value 413 based on the contact points 406 and the simulation parameters 480.

Instead of using fixed parameter values that are the same across a number of users, the ML model 404 may be trained to predict one or more simulation parameters 480, which can increase the accuracy of the simulation. For example, the ML model 404 may be configured to predict skin elasticity 482 using at least the 3D model 410. Skin elasticity 482 is the skin's ability to stretch and turn to its original shape (e.g. where a high value indicates that the skin is more elastic than a low value (or vice versa)). Some users have skin that is more elastic than other users, which can affect the wearable fit evaluation. The predicted value for the skin elasticity 482 may affect computation of the wearable fit value 413, where a higher skin elasticity value may reduce (or adjust) the tolerance range associated with the contact points 406. To predict the skin elasticity 482, the ML model 404 may receive inputs such as face shape/size, the type or presence (or absence) of a bony structure under the predicted contact points 406, and/or a level of skin condition. For example, the ML model 404 (or the sizing simulator 402) may detect approximate age, skin condition from the detection of wrinkles, acne, or inconsistencies in the skin due to other skin conditions or dry spots, detection of bony structures on the face such as high cheekbones (which would not be very elastic), and/or estimation of the leanness of a face from the 3D model 410.

In some examples, the ML model 404 may be configured to predict device slippage tolerance 484 based on at least one of the 3D model 410, the 3D model 416, or the predicted contact points 406 between the 3D model 410 and the 3D model 416. Device slippage tolerance 484 is a parameter that represents a distance (e.g., allowable distance) the device can slip from the predicted contact points 406 before the user is likely to push the wearable device back to its original placement. Some users may have a higher tolerance for device slippage than other users. In the case of a head-mounted device 414 (e.g., smartglasses 496), the device slippage tolerance 484 may define a value that represents the amount of slippage along the nose from the predicted contact points 406 on the person's nose bridge. To predict device slippage tolerance 484, the ML model 404 may receive inputs such as steepness of the nose, the height difference between the ears and the nose or the eyes, the fitting of the frame 471 behind the ears, and/or the level of oiliness of the skin.

In some examples, the ML model 404 may be configured to predict tolerable contact pressure 485 based on at least one of the 3D model 410, the 3D model 416, or the predicted contact points 406 between the 3D model 410 and the 3D model 416. The tolerable contact pressure 485 is a parameter that indicates a level of accepted pressure (or force) on the relevant body part. For example, some users may have a higher tolerance of pressure than other users. In the case of a head-mounted device 414 (e.g., smartglasses 496), the tolerable contact pressure 485 is a value that represents a tolerable amount of pressure on the temple of the user (caused by the arm portions 474 of the smartglasses 496 contacting the person's temples). To predict tolerable contact pressure 485, the ML model 404 may receive inputs such as overall face shape, which may include the place of contact as well as a broader area to include more facial features which may indicate the person's age or skin condition. In some examples, the person's age or skin condition may impact how much a person can tolerate the pressure of the contact. In some examples, the ML model 404 may receive inputs such as the amount of surface area of the contact (e.g., a higher surface area may indicate that the force is spread over a larger area so it is more comfortable). In some examples, the ML model 404 is configured to receive the locations of the battery and the display device 495 (that is used to project the display 407). For example, these locations may generate more heat, and therefore may lead to discomfort when the wearable device is worn on the skin for a relatively long period of time.

In some examples, the ML model 404 may be configured to predict a nose shape 466 based on at least one of the 3D model 410. In some examples, the ML model 404 may be configured to predict a certain type of nose such as a low nose bridge profile. Certain models of wearable devices may be more suited for certain types of nose shape. To predict the nose shape 466, the ML model 404 may receive inputs such as the 3D structure of the nose, a full face model, and/or a red-green-blue (RGB) image. In some examples, a single ML model 404 is configured to predict the contact points 406, the skin elasticity 482, the device slippage tolerance 484, the tolerable contact pressure 485, and the nose shape 466. In some examples, a separate ML model 404 is provided for each of the contact points 406, the skin elasticity 482, the device slippage tolerance 484, the tolerable contact pressure 485, and the nose shape 466.

In addition, in some examples, the wearable fit engine 411 is configured to compute the wearable fit value 413 based on other simulation parameters (also referred to as wearable fit parameters) such as whether the frame 471 of the smartglasses 496 is wide enough to be comfortable with respect to the user's temples, whether the rim portions 409 and bridge portion 473 are sized so that the bridge portion 473 can rest comfortably on the bridge of the user's nose, whether the arm portions 474 are sized to comfortably rest on the user's ears, and other such comfort related considerations. The calculation of the wearable fit value 413 may also account for wearable fit parameters relating to as-worn parameters including how the user naturally wears the head-mounted display device 414, such as, for example, head posture/how the user naturally holds his/her head, how the user positions the head-mounted display device 414 relative to his/her face, and the like. The calculation of the wearable fit value 413 may also account for wearable fit parameters relating to whether the size and/or shape and/or contour of the frame 471 is aesthetically pleasing to the user and is compatible with the user's facial features.

The sizing simulator 402 may include a display fit engine 415 configured to calculate a display fit value 417 based on the contact points 406, where the display fit value 417 represents an amount of the display 407 that can be viewed by the person. A display fit value 417 above a threshold level may indicate that the display 407 projected by the smartglasses 496 can be substantially viewed by the user. In some examples, the sizing simulator 402 is configured to detect features such as pupil locations and ear saddle points based on the 3D model 410. The display fit engine 415 is configured to compute the display fit value 417 using the contact points 406 and other display fit parameters (or measurements) such as the pupil locations and ear saddle points. In some examples, ear saddle points include the points where the glasses naturally rest. For example, there is a saddle shape formed between the back of the ear and the head, and the ear saddle points may be the points that represent the contact points on the back of the ear. In some examples, the display fit engine 415 may use one or more of the simulation parameters 480 to compute the display fit value 417.

The sizing simulator 402 may select another 3D model 416 from the wearable device database 412. The sizing simulator 402 may input this newly selected 3D model 416 along with the same 3D model 410 that was used in the previous iteration to compute the contact points 406. The wearable fit engine 411 may use the contact points 406 (at least in part) to compute the wearable fit value 413. In some examples, the wearable fit engine 411 may use the contact points 406 and one or more simulation parameters 480 to compute the wearable fit value 413. The display fit engine 415 may use the contact points 406 (at least in part) to compute the display fit value 417. The sizing simulator 402 may repeat these operations for the other 3D models 416 in the wearable device database 412. In some examples, the sizing simulator 402 may identify those head-mounted display device 414 having wearable fit values 413 above a threshold level and/or identify those head-mounted display devices 414 having display fit values 417 above a threshold level. For example, the sizing simulator 402 may rank the head-mounted display device 414 based on their corresponding wearable fit values 413 and display fit values 417.

Figure 5:
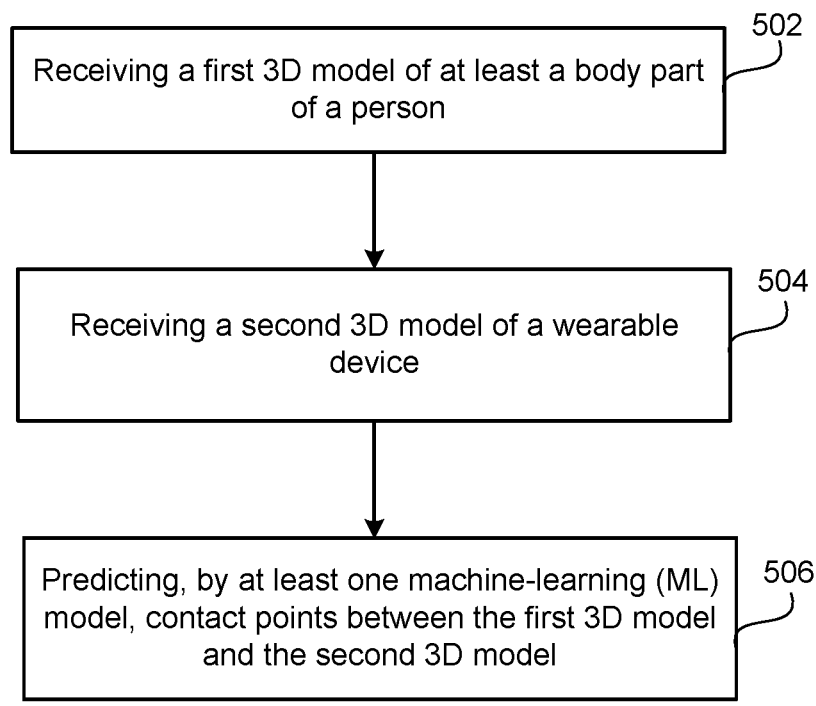
FIG. 5 illustrates a flowchart depicting example operation of predicting contact points between 3D models according to an aspect.

FIG. 5 illustrates a flowchart 500 depicting example operations of the computing system 100 of FIGS. 1A through 1C. Although the flowchart 500 is described with reference to the computing system 100 of FIGS. 1A through 1C, the flowchart 500 may be applicable to any of the embodiments herein. Although the flowchart 500 of FIG. 5 illustrates the operations in sequential order, it will be appreciated that this is merely an example, and that additional or alternative operations may be included. Further, operations of FIG. 5 and related operations may be executed in a different order than that shown, or in a parallel or overlapping fashion.

Operation 502 includes receiving a first 3D model 110 of at least a body part 108 of a person. Operation 504 includes receiving a second 3D model 116 of a wearable device 114. Operation 506 includes predicting, by at least one machine-learning (ML) model 104, contact points 106 between the first 3D model 110 and the second 3D model 116.

Figure 6:
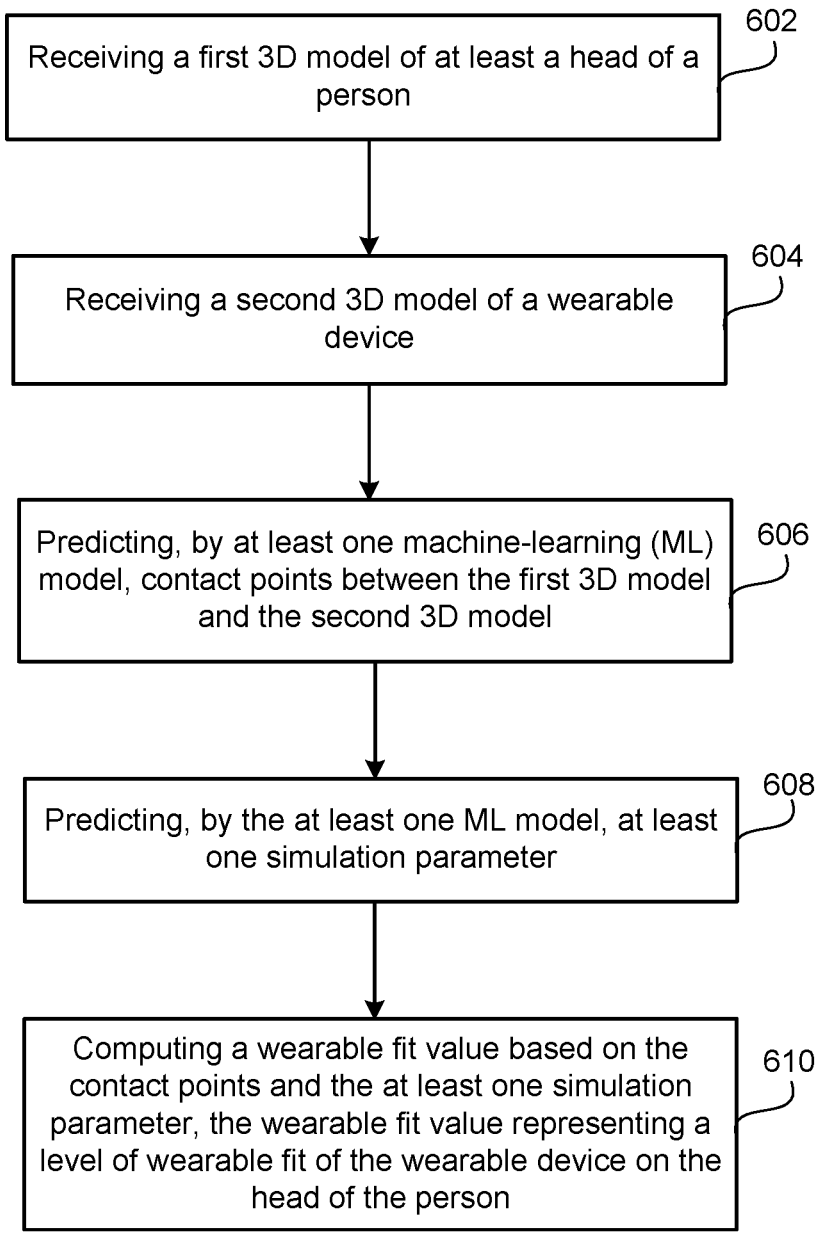
FIG. 6 illustrates a flowchart depicting example operations of predicting contact points between 3D models according to an aspect.

FIG. 6 illustrates a flowchart 600 depicting example operations of the computing system 400 of FIGS. 4A through 4CE Although the flowchart 600 is described with reference to the computing system 400 of FIGS. 4A through 1C, the flowchart 600 may be applicable to any of the embodiments herein. Although the flowchart 600 of FIG. 6 illustrates the operations in sequential order, it will be appreciated that this is merely an example, and that additional or alternative operations may be included. Further, operations of FIG. 6 and related operations may be executed in a different order than that shown, or in a parallel or overlapping fashion.

Operation 602 includes receiving a first 3D model 410 of at least a head of a person. Operation 604 includes receiving a second 3D model 416 of a head-mounted display device 414. Operation 606 includes predicting, by at least one machine-learning (ML) model 404, contact points 406 between the first 3D model 410 and the second 3D model 416. Operation 608 includes predicting, by the at least one ML model 404, at least one simulation parameter 480. In some examples, the simulation parameter 480 includes skin elasticity 482, device slippage tolerance 484, tolerable contact pressure 485, and/or nose shape 466. Operation 610 includes computing a wearable fit value 413 based on the contact points 406 and the at least one simulation parameter 480, where the wearable fit value 413 represents a level of wearable fit of the head-mounted display device 414 on the head of the person.

Figure 7:
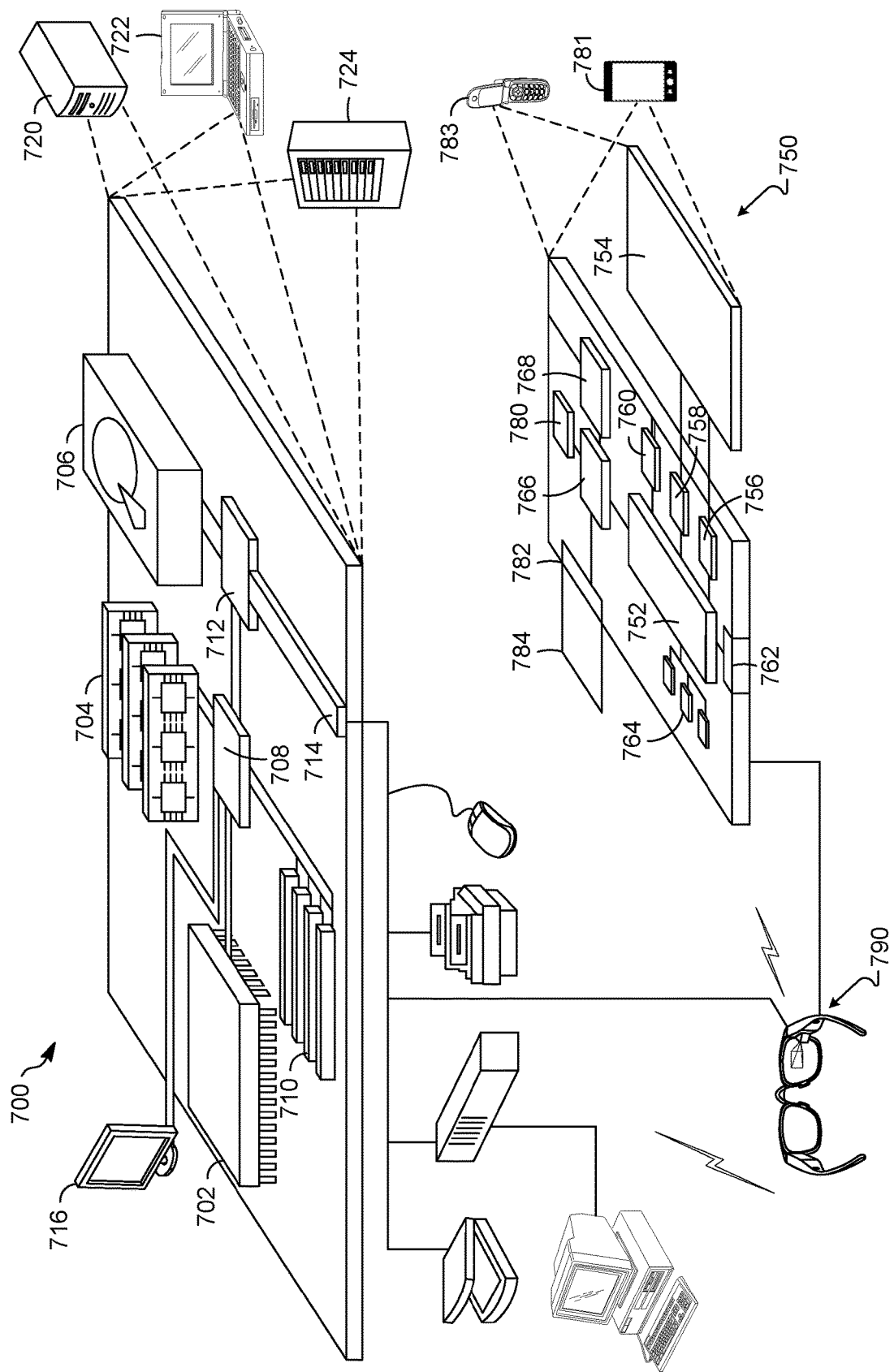
FIG. 7 illustrates example computing devices of the computing systems discussed herein according to an aspect.

FIG. 7 shows an example of a computing device 700 and a mobile computer device 750, which may be used with the techniques described here. Computing device 700 is intended to represent various forms of digital computers, such as laptops, desktops, tablets, workstations, personal digital assistants, smart devices, appliances, electronic sensor-based devices, televisions, servers, blade servers, mainframes, and other appropriate computing devices. Computing device 750 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 700 includes a processor 702, memory 704, a storage device 706, a high-speed interface 708 connecting to memory 704 and high-speed expansion ports 710, and a low speed interface 712 connecting to low speed bus 714 and storage device 706. The processor 702 can be a semiconductor-based processor. The memory 704 can be a semiconductor-based memory. Each of the components 702, 704, 706, 708, 710, and 712, are interconnected using various busses, and may be mounted on a common motherboard or in other manners as appropriate. The processor 702 can process instructions for execution within the computing device 700, including instructions stored in the memory 704 or on the storage device 706 to display graphical information for a GUI on an external input/output device, such as display 716 coupled to high speed interface 708. In other implementations, multiple processors and/or multiple buses may be used, as appropriate, along with multiple memories and types of memory. Also, multiple computing devices 700 may be connected, with each device providing portions of the necessary operations (e.g., as a server bank, a group of blade servers, or a multi-processor system).

The memory 704 stores information within the computing device 700. In one implementation, the memory 704 is a volatile memory unit or units. In another implementation, the memory 704 is a non-volatile memory unit or units. The memory 704 may also be another form of computer-readable medium, such as a magnetic or optical disk. In general, the computer-readable medium may be a non-transitory computer-readable medium.

The storage device 706 is capable of providing mass storage for the computing device 700. In one implementation, the storage device 706 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods and/or computer-implemented methods, such as those described above. The information carrier is a computer- or machine-readable medium, such as the memory 704, the storage device 706, or memory on processor 702.

The high speed controller 708 manages bandwidth-intensive operations for the computing device 700, while the low speed controller 712 manages lower bandwidth-intensive operations. Such allocation of functions is exemplary only. In one implementation, the high-speed controller 708 is coupled to memory 704, display 716 (e.g., through a graphics processor or accelerator), and to high-speed expansion ports 710, which may accept various expansion cards (not shown). In the implementation, low-speed controller 712 is coupled to storage device 706 and low-speed expansion port 714. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 700 may be implemented in a number of different forms, as shown in the figure. For example, it may be implemented as a standard server 720, or multiple times in a group of such servers. It may also be implemented as part of a rack server system 724. In addition, it may be implemented in a computer such as a laptop computer 722. Alternatively, components from computing device 700 may be combined with other components in a mobile device (not shown), such as device 750. Each of such devices may contain one or more of computing device 700, 750, and an entire system may be made up of multiple computing devices 700, 750 communicating with each other.

Computing device 750 includes a processor 752, memory 764, an input/output device such as a display 754, a communication interface 766, and a transceiver 768, among other components. The device 750 may also be provided with a storage device, such as a microdrive or other device, to provide additional storage. Each of the components 750, 752, 764, 754, 766, and 768, are interconnected using various buses, and several of the components may be mounted on a common motherboard or in other manners as appropriate.

The processor 752 can execute instructions within the computing device 750, including instructions stored in the memory 764. The processor may be implemented as a chipset of chips that include separate and multiple analog and digital processors. The processor may provide, for example, for coordination of the other components of the device 750, such as control of user interfaces, applications run by device 750, and wireless communication by device 750.

Processor 752 may communicate with a user through control interface 758 and display interface 756 coupled to a display 754. The display 754 may be, for example, a TFT LCD (Thin-Film-Transistor Liquid Crystal Display) or an OLED (Organic Light Emitting Diode) display, or other appropriate display technology. The display interface 756 may comprise appropriate circuitry for driving the display 754 to present graphical and other information to a user. The control interface 758 may receive commands from a user and convert them for submission to the processor 752. In addition, an external interface 762 may be provided in communication with processor 752, so as to enable near area communication of device 750 with other devices. External interface 762 may provide, for example, for wired communication in some implementations, or for wireless communication in other implementations, and multiple interfaces may also be used.

The memory 764 stores information within the computing device 750. The memory 764 can be implemented as one or more of a computer-readable medium or media, a volatile memory unit or units, or a non-volatile memory unit or units. Expansion memory 784 may also be provided and connected to device 750 through expansion interface 782, which may include, for example, a SIMM (Single In Line Memory Module) card interface. Such expansion memory 784 may provide extra storage space for device 750, or may also store applications or other information for device 750. Specifically, expansion memory 784 may include instructions to carry out or supplement the processes described above, and may include secure information also. Thus, for example, expansion memory 784 may be provided as a security module for device 750, and may be programmed with instructions that permit secure use of device 750. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 764, expansion memory 784, or memory on processor 752, that may be received, for example, over transceiver 768 or external interface 762.

Device 750 may communicate wirelessly through communication interface 766, which may include digital signal processing circuitry where necessary. Communication interface 766 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 768. In addition, short-range communication may occur, such as using a Bluetooth, low power Bluetooth, Wi-Fi, or other such transceiver (not shown). In addition, GPS (Global Positioning System) receiver module 780 may provide additional navigation- and location-related wireless data to device 750, which may be used as appropriate by applications running on device 750.

Device 750 may also communicate audibly using audio codec 760, which may receive spoken information from a user and convert it to usable digital information. Audio codec 760 may likewise generate audible sound for a user, such as through a speaker, e.g., in a handset of device 750. Such sound may include sound from voice telephone calls, may include recorded sound (e.g., voice messages, music files, etc.) and may also include sound generated by applications operating on device 750.

The computing device 750 may be implemented in a number of different forms, as shown in the figure. For example, it may be implemented as a cellular telephone 783. It may also be implemented as part of a smart phone 781, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as modules, programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor, or LED (light emitting diode)) for displaying information to the user and a keyboard and a pointing device (e.g., a mouse or a trackball) by which the user can provide input to the computer. Other kinds of devices can be used to provide for interaction with a user as well. For example, feedback provided to the user can be any form of sensory feedback (e.g., visual feedback, auditory feedback, or tactile feedback), and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

In some embodiments, the computing devices depicted in FIG. 7 can include sensors that interface with an AR/VR headset (AR glasses/eyeglasses/VR headset/AR headset/ HMID device 790). For example, one or more sensors included on computing device 750 or other computing device depicted in FIG. 7, can provide input to AR/VR headset 790 or in general, provide input to an AR/VR space. The sensors can include, but are not limited to, a touchscreen, accelerometers, gyroscopes, pressure sensors, biometric sensors, temperature sensors, humidity sensors, and ambient light sensors. Computing device 750 can use the sensors to determine an absolute position and/or a detected rotation of the computing device in the AR/VR space that can then be used as input to the AR/VR space. For example, computing device 750 may be incorporated into the AR/VR space as a virtual object, such as a controller, a laser pointer, a keyboard, a weapon, etc. Positioning of the computing device/virtual object by the user when incorporated into the AR/VR space can allow the user to position the computing device to view the virtual object in certain manners in the AR/VR space.

In some embodiments, one or more input devices included on, or connected to, the computing device 750 can be used as input to the AR/VR space. The input devices can include, but are not limited to, a touchscreen, a keyboard, one or more buttons, a trackpad, a touchpad, a pointing device, a mouse, a trackball, a joystick, a camera, a microphone, earphones or buds with input functionality, a gaming controller, or other connectable input device. A user interacting with an input device included on the computing device 750 when the computing device is incorporated into the AR/VR space can cause a particular action to occur in the AR/VR space.

In some embodiments, one or more output devices included on the computing device 750 can provide output and/or feedback to a user of the AR/VR headset 790 in the AR/VR space. The output and feedback can be visual, tactical, or audio. The output and/or feedback can include, but is not limited to, rendering the AR/VR space or the virtual environment, vibrations, turning on and off or blinking and/or flashing of one or more lights or strobes, sounding an alarm, playing a chime, playing a song, and playing of an audio file. The output devices can include, but are not limited to, vibration motors, vibration coils, piezoelectric devices, electrostatic devices, light emitting diodes (LEDs), strobes, and speakers.

In some embodiments, computing device 750 can be placed within AR/VR headset 790 to create an AR/VR system. AR/VR headset 790 can include one or more positioning elements that allow for the placement of computing device 750, such as smart phone 781, in the appropriate position within AR/VR headset 790. In such embodiments, the display of smart phone 781 can render stereoscopic images representing the AR/VR space or virtual environment.

In some embodiments, the computing device 750 may appear as another object in a computer-generated, 3D environment. Interactions by the user with the computing device 750 (e.g., rotating, shaking, touching a touchscreen, swiping a finger across a touch screen) can be interpreted as interactions with the object in the AR/VR space. As just one example, computing device can be a laser pointer. In such an example, computing device 750 appears as a virtual laser pointer in the computer-generated, 3D environment. As the user manipulates computing device 750, the user in the AR/VR space sees movement of the laser pointer. The user receives feedback from interactions with the computing device 750 in the AR/VR environment on the computing device 750 or on the AR/VR headset 790.

In some embodiments, a computing device 750 may include a touchscreen. For example, a user can interact with the touchscreen in a particular manner that can mimic what happens on the touchscreen with what happens in the AR/VR space. For example, a user may use a pinching-type motion to zoom content displayed on the touchscreen. This pinching-type motion on the touchscreen can cause information provided in the AR/VR space to be zoomed. In another example, the computing device may be rendered as a virtual book in a computer-generated, 3D environment. In the AR/VR space, the pages of the book can be displayed in the AR/VR space and the swiping of a finger of the user across the touchscreen can be interpreted as turning/flipping a page of the virtual book. As each page is turned/flipped, in addition to seeing the page contents change, the user may be provided with audio feedback, such as the sound of the turning of a page in a book.

In some embodiments, one or more input devices in addition to the computing device (e.g., a mouse, a keyboard) can be rendered in a computer-generated, 3D environment. The rendered input devices (e.g., the rendered mouse, the rendered keyboard) can be used as rendered in the AR/VR space to control objects in the AR/VR space.

A number of embodiments have been described. Nevertheless, it will be understood that various modifications may be made without departing from the spirit and scope of the invention.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

Further to the descriptions above, a user is provided with controls allowing the user to make an election as to both if and when systems, programs, devices, networks, or features described herein may enable collection of user information (e.g., information about a user's social network, social actions, or activities, profession, a user's preferences, or a user's current location), and if the user is sent content or communications from a server. In addition, certain data may be treated in one or more ways before it is stored or used, so that user information is removed. For example, a user's identity may be treated so that no user information can be determined for the user, or a user's geographic location may be generalized where location information is obtained (such as to a city, ZIP code, or state level), so that a particular location of a user cannot be determined. Thus, the user may have control over what information is collected about the user, how that information is used, and what information is provided to the user.

The computer system (e.g., computing device) may be configured to wirelessly communicate with a network server over a network via a communication link established with the network server using any known wireless communications technologies and protocols including radio frequency (RF), microwave frequency (MWF), and/or infrared frequency (IRF) wireless communications technologies and protocols adapted for communication over the network.

In accordance with aspects of the disclosure, implementations of various techniques described herein may be implemented in digital electronic circuitry, or in computer hardware, firmware, software, or in combinations of them. Implementations may be implemented as a computer program product (e.g., a computer program tangibly embodied in an information carrier, a machine-readable storage device, a computer-readable medium, a tangible computer-readable medium), for processing by, or to control the operation of, data processing apparatus (e.g., a programmable processor, a computer, or multiple computers). In some implementations, a tangible computer-readable storage medium may be configured to store instructions that when executed cause a processor to perform a process. A computer program, such as the computer program(s) described above, may be written in any form of programming language, including compiled or interpreted languages, and may be deployed in any form, including as a standalone program or as a module, component, subroutine, or other unit suitable for use in a computing environment. A computer program may be deployed to be processed on one computer or on multiple computers at one site or distributed across multiple sites and interconnected by a communication network.

Specific structural and functional details disclosed herein are merely representative for purposes of describing example embodiments. Example embodiments, however, may be embodied in many alternate forms and should not be construed as limited to only the embodiments set forth herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature in relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 70 degrees or at other orientations) and the spatially relative descriptors used herein may be interpreted accordingly.

Example embodiments of the concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the described concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, the terms (including technical and scientific terms) used herein have the same meaning as commonly understood by one of ordinary skill in the art to which these concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

While certain features of the described implementations have been illustrated as described herein, many modifications, substitutions, changes, and equivalents will now occur to those skilled in the art. It is, therefore, to be understood that the appended claims are intended to cover such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components, and/or features of the different implementations described.

What is claimed is:

1. A method, comprising:
receiving a first three-dimensional model (3D) model of at least a body part of a person;
receiving a second 3D model of a wearable device;
predicting, by at least one machine-learning (ML) model using the first 3D model and the second 3D model as inputs, a plurality of contact points between the first 3D model and the second 3D model; and
compute a wearable fit value based on the plurality of contact points, the wearable fit value representing a level of wearable fit of the wearable device on the body part of the person.

2. The method of claim 1, further comprising:
simulating a placement of the second 3D model on the first 3D model.

3. The method of claim 1, wherein the wearable device includes a head-mounted display device configured to project a display.

4. The method of claim 1, further comprising:
receiving image data from an image sensor; and
generating the first 3D model based on the image data.

5. The method of claim 1, further comprising:
computing a wearable fit value based on the plurality of contact points, the wearable fit value representing a level of wearable fit of the wearable device on the body part of the person.

6. The method of claim 1, further comprising:
predicting, by the at least one ML model, at least one simulation parameter using at least one of the first 3D model or the second 3D model; and
computing a wearable fit value based on the plurality of contact points and the at least one simulation parameter, the wearable fit value representing a level of wearable fit of the wearable device on the body part of the person.

7. The method of claim 6, wherein the at least one simulation parameter includes skin elasticity.

8. The method of claim 6, wherein the at least one simulation parameter includes device slippage tolerance.

9. The method of claim 6, wherein the at least one simulation parameter includes tolerable contact pressure.

10. The method of claim 6, wherein the at least one simulation parameter includes nose shape.

11. A computing system, comprising:
at least one processor; and
a non-transitory computer-readable medium storing executable instructions that when executed by the at least one processor cause the at least one processor to:
receive a first 3D model of at least a body part of a person;
receive a second 3D model of a wearable device;
predict, by at least one machine-learning (ML) model using the first 3D model and the second 3D model as inputs, a plurality of contact points between the first 3D model and the second 3D model; and
compute a wearable fit value based on the plurality of contact points, the wearable fit value representing a level of wearable fit of the wearable device on the body part of the person.

12. The computing system of claim 11, wherein the executable instructions include instructions that when executed by the at least one processor cause the at least one processor to:
predict, by the at least one ML model, at least one simulation parameter using at least one of the first 3D model or the second 3D model,
wherein the wearable fit value is based on the plurality of contact points and the at least one simulation parameter.

13. The computing system of claim 12, wherein the at least one simulation parameter includes at least one of skin elasticity, device slippage tolerance, tolerable contact pressure, or nose shape.

14. The computing system of claim 11, wherein the wearable device includes a head-mounted display device configured to project a display, wherein the executable instructions include instructions that when executed by the at least one processor cause the at least one processor to:
compute a display fit value based on the plurality of contact points, the display fit value representing an amount of the display that can be viewed by the person.

15. The computing system of claim 11, wherein the first 3D model is received over a network from a computing device.

16. The computing system of claim 11, wherein the executable instructions include instructions that when executed by the at least one processor cause the at least one processor to:
receive image data over a network from a computing device; and
generate the first 3D model based on the image data.

17. A non-transitory computer-readable medium storing executable instructions that when executed by at least one processor cause the at least one processor to:
receive a first 3D model of at least a head of a person;
receive a second 3D model of a head-mounted display device;
predict, by at least one machine-learning (ML) model, a plurality of contact points between the first 3D model and the second 3D model;
predict, by the at least one ML model using the first 3D model and the second 3D model as inputs, at least one simulation parameter; and
compute a wearable fit value based on the plurality of contact points and the at least one simulation parameter, the wearable fit value representing a level of wearable fit of the head-mounted display device on the head of the person.

18. The non-transitory computer-readable medium of claim 17, wherein the at least one simulation parameter includes at least one of skin elasticity, device slippage tolerance, tolerable contact pressure, or nose shape.

19. The non-transitory computer-readable medium of claim 17, wherein the head-mounted display device is configured to project a display, wherein the executable instructions include instructions that when executed by the at least one processor cause the at least one processor to:
compute a display fit value based on the plurality of contact points, the display fit value representing an amount of the display that can be viewed by the person.

20. The non-transitory computer-readable medium of claim 17, wherein the executable instructions include instructions that when executed by the at least one processor cause the at least one processor to:
simulate a placement of the second 3D model on the first 3D model.

* * * * *